(12) United States Patent
Ashikaga

(10) Patent No.: US 6,496,407 B2
(45) Date of Patent: Dec. 17, 2002

(54) FERROELECTRIC MEMORY

(75) Inventor: Kinya Ashikaga, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/741,029

(22) Filed: Dec. 21, 2000

(65) Prior Publication Data

US 2002/0036915 A1 Mar. 28, 2002

(30) Foreign Application Priority Data

Sep. 11, 2000 (JP) ........................................ 2000-275208

(51) Int. Cl.[7] ............................................... G11C 11/22
(52) U.S. Cl. ....................................... 365/145; 365/148
(58) Field of Search ................................ 365/145, 148, 365/149, 102

(56) References Cited

U.S. PATENT DOCUMENTS 5,898,609 A * 4/1999 Yoo ............................ 365/145
6,323,513 B1 * 11/2001 Schindler et al. ............ 257/296
2001/0036101 A1 * 11/2001 Schlosser et al. ............ 365/145

* cited by examiner

Primary Examiner—Vu A. Le
(74) Attorney, Agent, or Firm—Michael A. Sartori; Venable

(57) ABSTRACT

A ferroelectric memory of the present invention comprises a memory cell which includes a select transistor whose control electrode, first electrode and second electrode are respectively connected to a word line, a bit line and a first node, a ferroelectric capacitor whose first electrode and second electrode are respectively connected to the first node and connected to a plate line through a second node, and a resistor connected between the first node and the second node.

6 Claims, 7 Drawing Sheets

FERROELECTRIC MEMORY

BACKGROUND OF THE INVENTION

1. Field of the Invention

The present invention relates to a non-volatile memory, and particularly to a memory cell structure of a ferroelectric memory using a ferroelectric thin film.

2. Description of the Related Art

There has recently been much growing interest in a memory using a ferroelectric substance. A ferroelectric memory stores therein information through the use of spontaneous polarization of the ferroelectric substance. Therefore, if a voltage is applied to the ferroelectric substance to align polarization in the same direction, then the polarization remains (this is called "remnant polarization") even after the power is turned off. Thus, the ferroelectric memory can be utilized as a nonvolatile memory. The conventional non-volatile memory needs a high voltage of 10 V or higher upon writing of data therein, and a write speed thereof comes into the world of microseconds (msec). On the other hand, the ferroelectric memory is capable of polarization reversal at a few V, and a reversal speed thereof comes into the world of nanoseconds (nsec). The ferroelectric memory has been expected as a non-volatile memory capable of performing a low-voltage operation and a high-speed operation from such a background. A currently developed/proposed ferroelectric memory comprises a memory cell comprised of a MOS transistor and a ferroelectric capacitor.

However, the conventional ferroelectric memory has the possibility that when the state of polarization of the ferroelectric capacitor lies in a direction indicated by an arrow ↓, the application of a voltage lying in the same direction as the polarization to the ferroelectric capacitor will be maintained. At this time, so-called in-print deterioration is developed and interferes with a reverse operation of the polarization of the ferroelectric capacitor from the direction indicated by an arrow ↓ to that indicated by an arrow ↑, thus causing a possibility that misreading will be brought about. Incidentally, the in-print deterioration means a shift or displacement of a hysteresis loop, which is developed due to the temperature, pressure, mechanical stress, etc. in the manufacturing process.

It is known that while the writing of data into a memory cell is carried out by application of a voltage having an H level to a data line, the polarization of the ferroelectric capacitor is slightly reduced. This is called "depolarization". The time constant of the depolarization is 1 msec or more, and the depolarization is normally unsaturated even after a word line is brought to an L level. In other words, this means that the polarization continues to decrease even after the ferroelectric capacitor is brought to a floating state.

Since an electrical charge produced in an electrode does not change even if the ferroelectric memory is reduced in polarization, a potential is developed across the ferroelectric capacitor. The direction of an electric field thereof is the same as the direction of polarization. Since the memory cell is polarized in a direction indicated by an arrow ↑, a potential having an H level is developed at a node on the select transistor side of the ferroelectric capacitor. Since, however, the select transistor is normally an N channel MOS transistor, a positive potential applied to the node on the select transistor side of the capacitor is hard to be discharged. Thus, the voltage lying in the same direction as the polarization continues to be applied to the ferroelectric capacitor for a while.

SUMMARY OF THE INVENTION

With the foregoing in view, it is therefore an object of the present invention to provide a ferroelectric memory capable of, when the state of polarization of a ferroelectric capacitor is in a direction indicated by an arrow ↓, restraining in-print deterioration, and smoothly performing a reverse operation of the polarization of the ferroelectric capacitor from the direction indicated by an arrow ↓ to that indicated by an arrow ↑, and carrying out a normal read operation.

According to one aspect of the present invention, for achieving the above object, there is provided a ferroelectric memory comprising a memory cell including a select transistor whose control electrode, first electrode and second electrode are respectively connected to a word line, a bit line and a first node, a ferroelectric capacitor whose first electrode and second electrode are respectively connected to the first node and connected to a plate line through a second node, and a resistor connected between the first node and the second node.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

Figure 1:
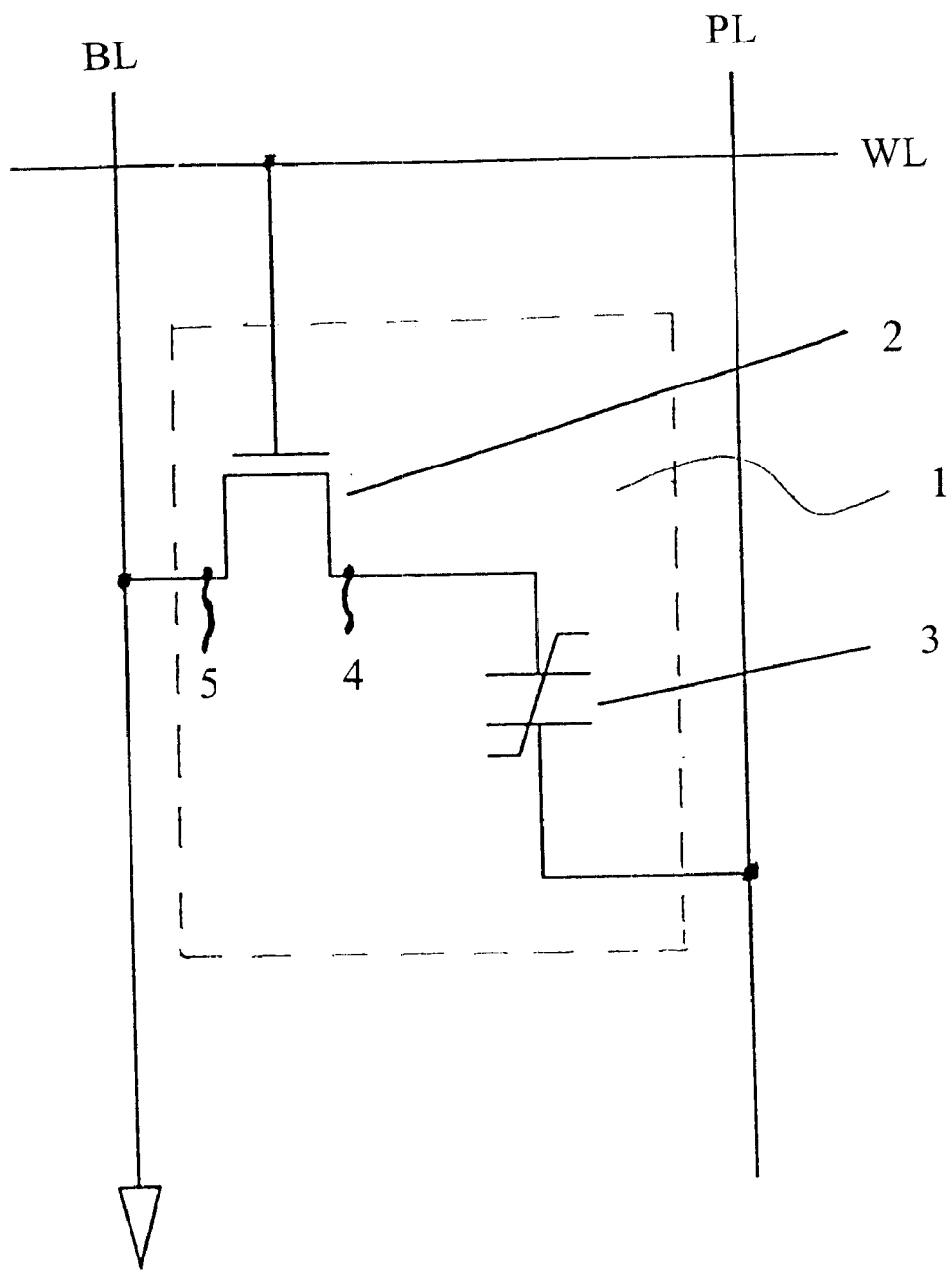
FIG. 1 is a circuit diagram showing a memory cell configuration of a ferroelectric memory.

The principle of operation of a memory cell in a ferroelectric memory will first be described. FIG. 1 is a circuit diagram showing a memory cell configuration of a ferroelectric memory. The writing of data into the memory cell is performed as follows. When, for example, a bit line BL is set to 0 V and a positive voltage is applied to a plate line PL after a memory cell 1 has been selected by a word line WL, the polarization of a ferroelectric memory 3 is aligned in a direction indicated by an arrow ↑. Therefore, information about "0" is stored in the memory cell 1. On the other hand, when a positive voltage is applied to the bit line BL and the plate line PL is brought to 0 V, the polarization of the ferroelectric memory 3 is aligned in a direction indicated by arrow ↓. Therefore, information about "1" is stored in the memory cell 1. The reading of data from the memory cell is carried out as follows. When, for example, the bit line BL is precharged to 0 V and the plate line PL is set to a positive voltage, the direction of the polarization of the ferroelectric capacitor 3 is reversed when the ferroelectric capacitor 3 is polarized in the ↓ direction, and the direction of the polarization thereof is not reversed when the ferroelectric capacitor 3 is polarized in the ↑ direction. Therefore, the reading of the data from the memory cell takes advantage of the fact that changes in potential of the bit line BL differ according to the state of polarization of the ferroelectric capacitor. Described specifically, the difference between the changes in potential of the bit line BL is sensed by a sense amplifier (not shown) connected to the bit line BL to thereby read out the information stored in the memory cell 1.

A dummy cell (not shown) in which information opposite to information to be read has been stored in advance, is now used for a reference input for determining information by the sense amplifier. This type of ferroelectric capacitor is generally called a two-transistor two-capacitor type, which comprises two memory cells in which data complementary to each other in one information are stored.

Figure 2:
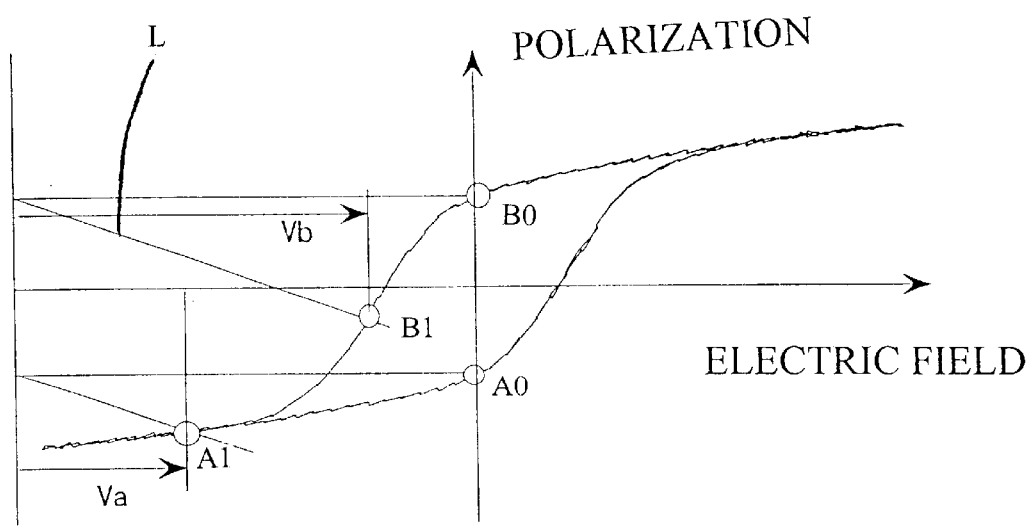
FIG. 2 is an explanatory diagram illustrating the state of polarization of the ferroelectric memory at a read operation thereof.

FIG. 2 is an explanatory diagram showing the state of polarization of the ferroelectric memory at its data read operation. The horizontal axis indicates an electric field and the vertical axis indicates the polarization. Since the bit line BL has a capacitance included in the bit line BL itself and intentionally-loaded capacitance (both collectively called "bit line capacitance or capacity $C_{BL}$"), a change in potential of the bit line BL at reading takes place according to a change in electrical charge stored in the bit line capacity $C_{BL}$. A straight line L, which crosses a hysteresis curve, indicates the bit line BL, and the inclination thereof is equivalent to the bit line capacity $C_{BL}$. When a voltage is applied to the plate line PL where the state of polarization of the ferroelectric capacitor is A0, the state of polarization of the ferroelectric capacitor transitions from A0 to A1. The potential on the bit line BL at this time becomes Va. On the other hand, when a voltage is applied to the plate line PL where the state of polarization of the ferroelectric capacitor is B0, the state of polarization of the ferroelectric capacitor shifts from B0 to B1. The potential on the bit line BL at this time reaches Vb. Thus, a potential difference ΔV to be read by the sense amplifier results in Vb−Va. It is necessary to set the value of ΔV as large as possible and reduce variations in its value for the purpose of allowing the sense amplifier to accurately read information.

First Embodiment

Figure 3:
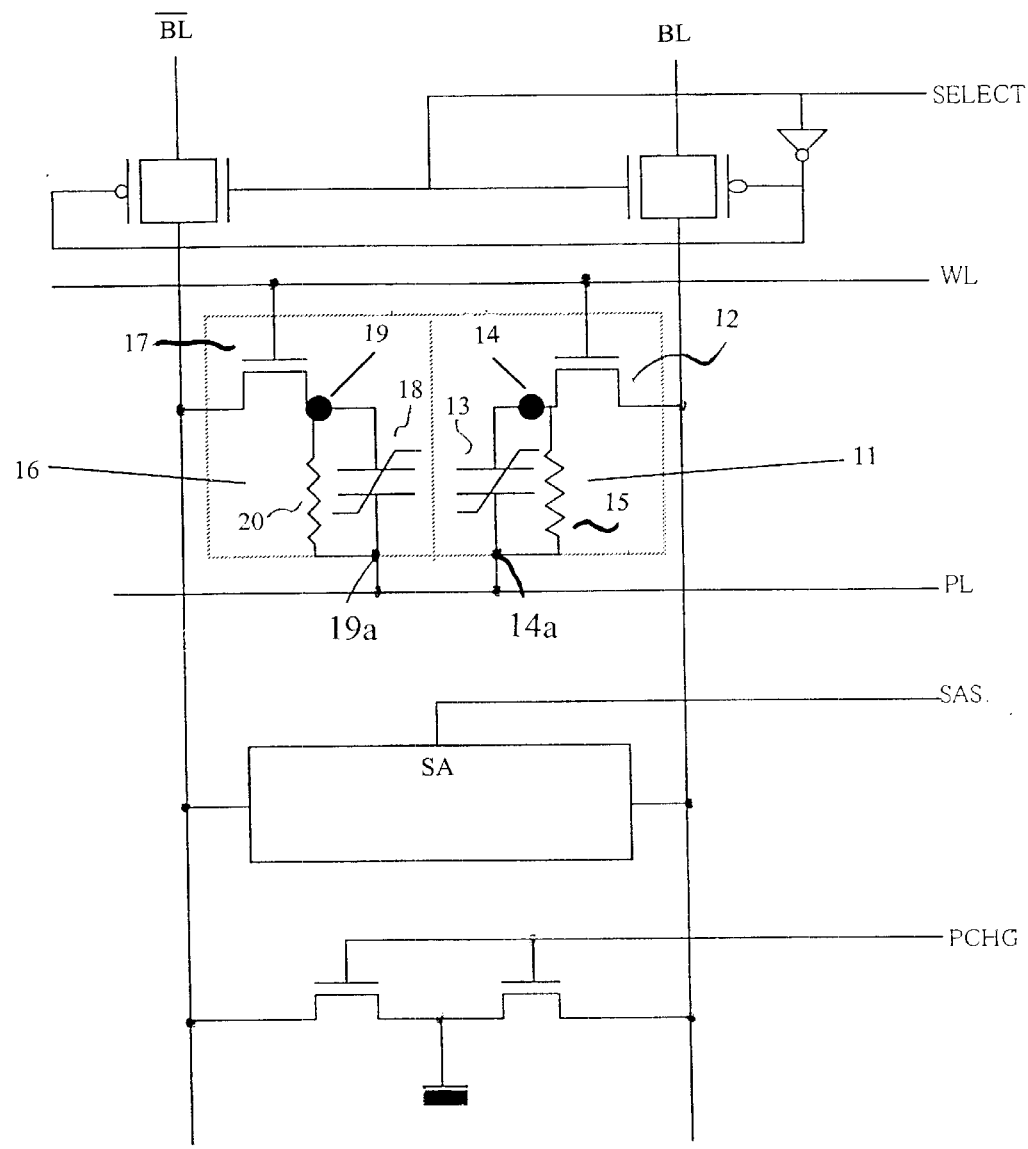
FIG. 3 is a circuit diagram depicting a ferroelectric memory according to a first embodiment of the present invention.

FIG. 3 is a circuit diagram showing a ferroelectric memory according to a first embodiment of the present invention. A memory cell 11 includes an N channel MOS transistor 12 used as a select transistor, a ferroelectric capacitor 13, a node 14 provided between the select transistor 12 and the ferroelectric capacitor 13, and a resistor 15 for short-circuiting between the node 14 and a plate line PL. A dummy memory cell 16 is identical in configuration to the memory cell 11 and includes a select transistor 17, a ferroelectric capacitor 18, a node 19 and a resistor 20.

Each of the resistors 15 and 20 can comprise a wiring resistance or a diffused resistance. It is necessary to set the resistance values of the resistors 15 and 20 to such values that the time constant of a discharge developed through a junction leak current becomes smaller than that of depolarization of the ferroelectric memory and they do not exert an influence on the transfer of an electric charge at data reading. In the present embodiment, the resistance values thereof were respectively set to 10 MΩ ($10^7$ Ω). In the present embodiment, a bismuth perovskite structural oxide $SrBi_2Ta_2O_9$ (hereinafter called simply "SBT film") is adopted as a ferroelectric film. The SBT film has a dielectric constant of 200, a film thickness of 200 nm and a capacitor area of 10 $\mu m^2$. Assuming that a read cycle time is set to 100 nsec under a 3.3 V operation, the amounts of electrical charges which flow through the resistors 15 and 20, are respectively equivalent to 1/100 of a switching charge amount, and the time constant of the discharge results in 1 msec. Namely, the resistors 15 and 20 fully satisfy the set conditions.

Figure 4:
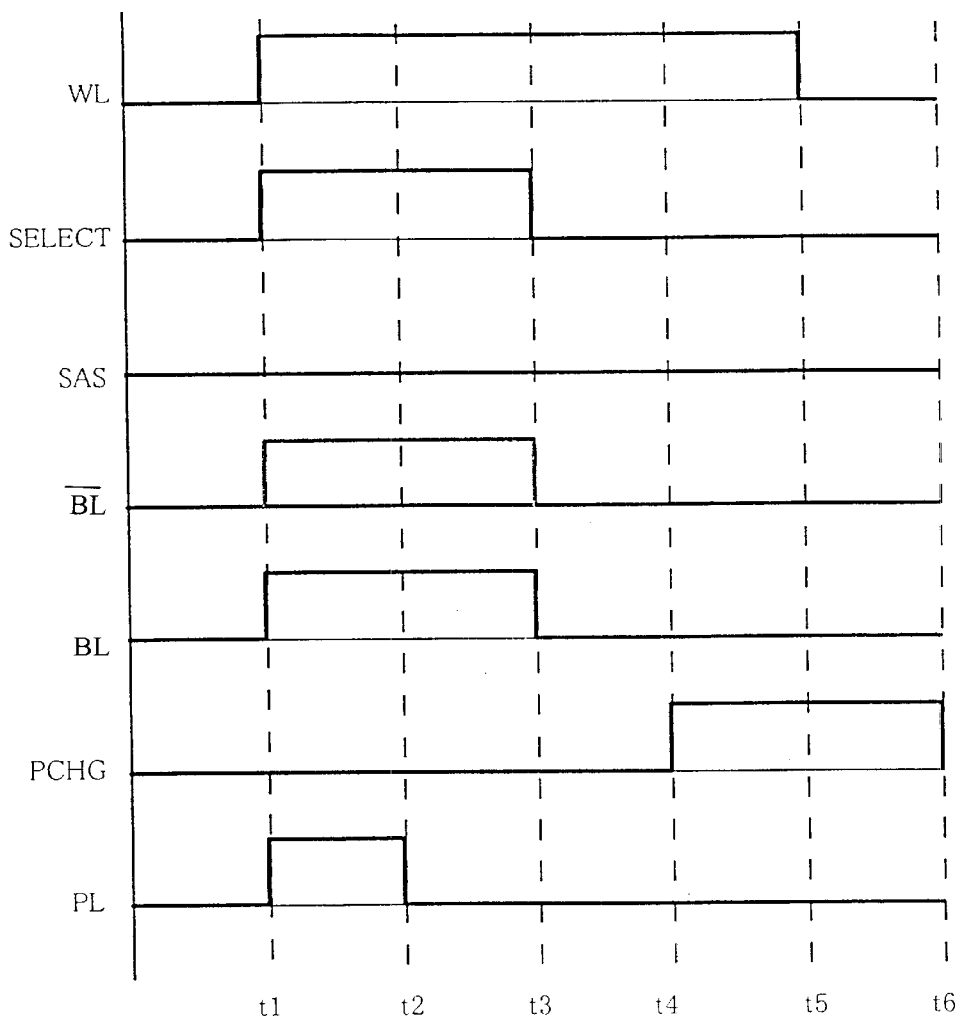
FIG. 4 is a timing chart for describing a write operation employed in the first embodiment of the present invention.

The operation of the memory cell 11 for writing data lying in the ↓ direction into the ferroelectric capacitor 13 will next be explained by way of example. FIG. 4 is a timing chart for describing a data write operation employed in the first embodiment of the present invention. At a time t1, the plate line PL and a bit line BL are respectively set to an H level simultaneously with the time when a select signal line SELECT is brought to an H level and a selected word line WL is brought to an H level. While a voltage, which induces polarization in a direction indicated by an arrow ↑, is applied to the ferroelectric capacitor 18 of the dummy memory cell 16 at this time, no voltage is applied to the ferroelectric capacitor 13 of the memory cell 11. When the plate line PL is changed from an H level to an L level at a time t2, the voltage applied via nodes 14a and 19a to the ferroelectric capacitors 13 and 18, respectively, becomes 0 but a voltage, which induces polarization in a direction indicated by an arrow ↓, is applied to the ferroelectric capacitor 13 of the memory cell 11. At a time t3, the bit line BL is changed to an L level and the select signal line SELECT is changed to an L level. At a time t4, a precharge signal line PCHG is changed from an L level to an H level to bring the bit line BL to a ground level. At a time t5, the word line WL is changed from the H level to an L level, and the precharge signal line PCHG is changed from the H level to the L level at a time t6, whereby the sequential data write operation is completed.

The effect of applying the voltage to the ferroelectric capacitor according to the depolarization at the memory operation is produced at the node 14, and the effect is virtually insignificant at the node 19. The application of the voltage according to the depolarization becomes pronounced at the time t5 or later at which the word line WL is brought to a non-selected state.

Figure 5:
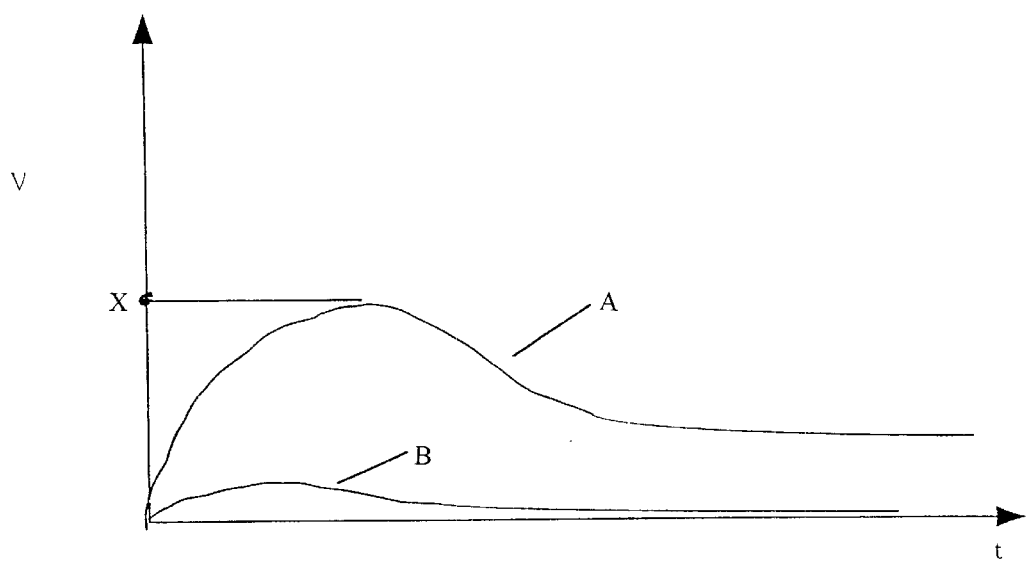
FIG. 5 is an explanatory diagram showing a time change in capacitor potential of the ferroelectric memory.

FIG. 5 is an explanatory diagram showing a time change in potential of the ferroelectric capacitor 13. FIG. 5 particularly shows a time change in potential at the node 14 from the time t5 up. In a conventional example (indicated by a curve A) in which no resistor is provided between a node provided between a select transistor and a ferroelectric capacitor and a plate line PL, the potential at the node provided between the select transistor and the ferroelectric capacitor rises according to depolarization of the ferroelectric capacitor, and decreases with a discharge developed through a junction leak current of the select transistor with a given point X as the peak. On the other hand, according to the present embodiment represented by a curve B, since the time constant of the discharge developed through the junction leak current is set so as to become shorter than that of depolarization of the ferroelectric memory, a rise in the potential at the node 14 is slight from the time t5 up.

According to the first embodiment, since there is provided the resistor for short-circuiting between the node provided between the select transistor and the ferroelectric capacitor in the memory cell and the plate line, the positive potential can easily be discharged even if the positive potential is applied to the node on the select transistor side of the ferroelectric capacitor due to the depolarization of the ferroelectric capacitor. Thus, in-print deterioration can be restrained.

Second Embodiment

Since a second embodiment of the present invention is identical to the memory cell of the conventional ferroelectric memory in circuit configuration, it will be explained using FIG. 1. A memory cell 1 is provided with a select transistor 2 comprised of an N channel MOS transistor, and a ferroelectric capacitor 3. The select transistor 2 has a first electrode 5 electrically connected to a bit line BL and a second electrode 4 electrically connected to the ferroelectric capacitor 3. Each of the first and second electrodes 5 and 4 comprises an N-type diffused layer. The present embodiment is characterized in that an impurity concentration of the N-type diffused layer constituting the second electrode 4 is set so as to be lower than that of the N-type diffused layer constituting the first electrode 5.

In a select transistor fabricated according to a conventional process, a junction leak current flowing in a reverse direction between an N-type diffused layer and a substrate is about $10^{-11}$A. On the other hand, a junction leak current flowing in a reverse direction between the N-type diffused layer and a substrate employed in the present embodiment is about $10^{-9}$A. At this time, the impurity concentration of the N-type diffused layer constituting the first electrode 5 ranges from about $10^{20}/cm^3$ to about $10^{21}/cm^3$ nearly equivalent to conventional one. On the other hand, the impurity concentration of the N-type diffused layer constituting the second electrode 4 ranges from about $10^{18}/cm^3$ to about $10^{19}/cm^3$. When the SBT film (whose dielectric constant, film thickness and capacitor area are respectively 200, 200 nm and 10 $\mu m^2$) is used as the ferroelectric film, the impurity concentration of the N-type diffused layer constituting each of the first and second electrodes 5 and 4 is set to such a range that the time constant based on the reverse resistance of a junction becomes smaller than that of depolarization of the ferroelectric memory and it does not interfere with operating characteristics.

Now, the interference with the operating characteristics means that when the level of the junction leak current increases, a voltage is applied to the ferroelectric capacitor due to noise on a plate lire PL kept in a non-selected state, whereby data might disappear.

Incidentally, since operation of the present embodiment and a time change in potential of the ferroelectric capacitor are based on the first embodiment, the description thereof will be omitted.

According to the second embodiment, the impurity concentration of the N-type diffused layer constituting the electrode connected to the ferroelectric capacitor of the select transistor is set lower than that of the N-type diffused layer constituting the electrode connected to the bit line BL. Therefore, even if a positive potential is applied to a node on the select transistor side of the ferroelectric capacitor due to the depolarization of the ferroelectric capacitor, it can be discharged relatively promptly. Thus, since the time required to apply the voltage to the ferroelectric capacitor becomes extremely short, in-print deterioration can be controlled.

Third Embodiment

Figure 6:
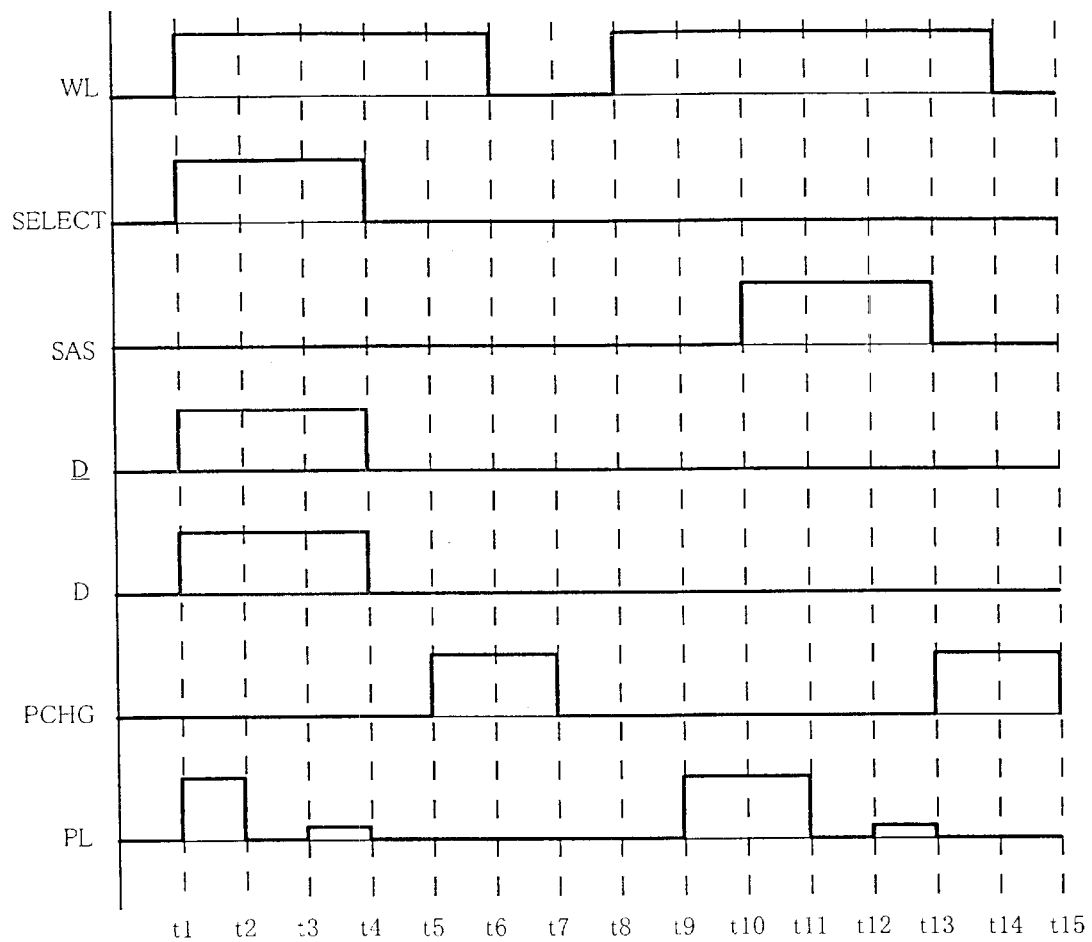
FIG. 6 is a timing chart for describing write/read operations employed in a third embodiment of the present invention.

Since a third embodiment of the present invention is identical to the memory cell of the conventional ferroelectric memory in circuit configuration, the description of its configuration will be omitted. FIG. 6 is a timing chart for describing data write/data read operations employed in the third embodiment of the present invention. The third embodiment of the present invention is characterized in that an intermediate potential level between an H level and an L level is applied to a plate line PL upon data writing.

The data write operation will first be explained. At a time t1, a bit line BL (or bit line /BL) is brought to an H level simultaneously with the time when a word line WL, a select signal line SELECT and a plate line PL are respectively set to an H level. Afterwards, the plate line PL is temporarily brought to an L level at a time t2. Further, the plate line PL is increased to an intermediate potential level between the H and L levels at a time t3. Subsequently, the plate line PL and the bit line BL (bit line /BL) are respectively brought to the L level at a time t4. Thereafter, a precharge signal line PCHG is brought to an H level at a time t5, and the word line WL is set to an L level at a time t6, whereby the data write operation is completed.

It is now necessary to set the intermediate potential level between the H and L levels smaller than an anti-voltage Vc of the ferroelectric capacitor. The intermediate potential level may preferably be set to about ⅓·Vc.

The data read operation will next be explained. The precharge signal line PCHG is brought to an L level at a time t7, the word line WL is brought to the H level at a time t8, and the plate line PL is brought to the H level at a time t9. Thereafter, a sense amplifier start-up signal line SAS is brought to an H level at a time t10 to thereby start up a sense amplifier. Afterwards, the plate line PL is temporarily brought to the L level at a time t11. Further, the plate line PL is increased to an intermediate potential level between the H and L levels. Subsequently, the sense amplifier start-up signal line SAS is brought to an L level and the precharge signal line PCHG is brought to the H level at a time t13 simultaneously with the time when the plate line PL is brought to the L level. The word line WL is brought to the L level at a time t14 and the precharge signal line PCHG is brought to the L level at a time t15, whereby the data read operation is finished.

Figure 7:
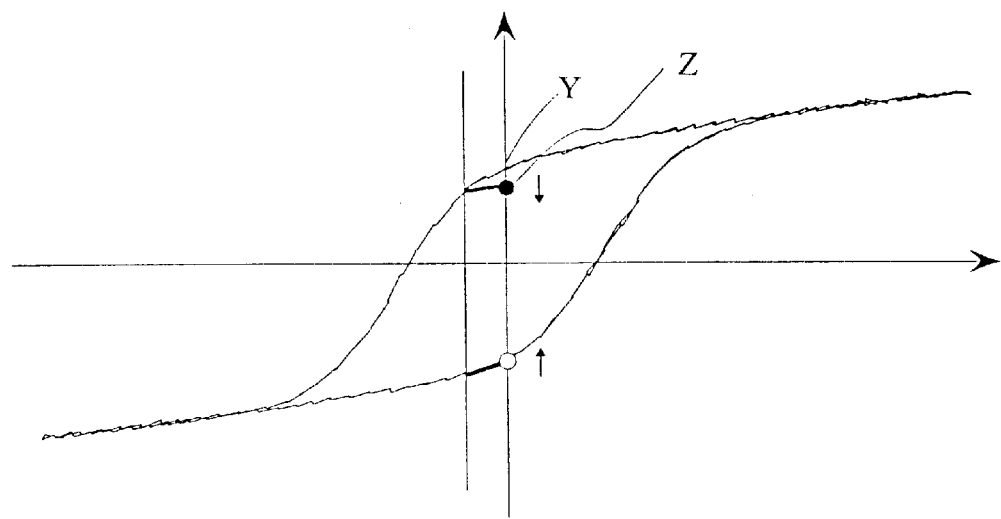
FIG. 7 is an explanatory diagram showing the state of polarization of a ferroelectric memory, which is developed immediately after the writing of data therein.

FIG. 7 is an explanatory diagram showing the state of polarization of a ferroelectric memory, which is developed immediately after the writing of data therein. When the state of polarization lies in a direction indicated by arrow ↓, the intermediate potential level between the H and L levels is applied to the plate line PL upon the data read operation, whereby the state of polarization subsequent to the data read operation is held in a state of polarization Z small as compared with the conventional state of polarization Y. The state of polarization Z is substantially equal to a state of polarization subsequent to the occurrence of depolarization after the normal data write operation. Thus, no depolarization occurs after the data write operation. Namely, since the occurrence of the positive potential produced by the depolarization is very limited, in-print deterioration can be limited to the minimum.

On the other hand, when the state of polarization lies in a direction indicated by an arrow ↑, the intermediate potential level between the H and L levels is applied to the plate line PL upon the data write operation. However, since the present direction is identical to the direction of polarization, no influence is exerted on polarization characteristics.

According to the ferroelectric memory of the present invention, when the state of polarization of the ferroelectric capacitor lies in the ↓ direction, the application of the voltage in the same direction as polarization is not maintained after the data write operation. It is therefore possible to control in-print deterioration. Accordingly, the reverse operation of the polarization of the ferroelectric capacitor from the ↓ direction to the ↑ direction can smoothly be carried out, and the normal read operation can be performed.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the present invention will cover any such modifications or embodiments falling within the true scope of the invention.

What is claimed is:

1. A ferroelectric memory, comprising:

a memory cell including, a select transistor having a control electrode, a first electrode and a second electrode, said control, first and second electrodes being respectively connected to a word line, a bit line and a first node; and a ferroelectric capacitor having a first electrode and second electrode, said first and second electrodes being respectively connected to the first node and connected to a plate line through a second node, wherein the writing of data into said memory cell brings the word line, the plate line and the bit line to a first potential level and changes the plate line from a first potential level to a second potential level, thereafter the plate line being brought to an intermediate potential level between the first potential level and the second potential level.

2. The ferroelectric memory according to claim 1, wherein the intermediate potential level is lower than an anti-voltage of said ferroelectric capacitor.

3. The ferroelectric memory according to claim 1, wherein the intermediate potential level is 1/3 of the anti-voltage of said ferroelectric capacitor.

4. A ferroelectric memory, comprising:

a memory cell including, a first select transistor having a control electrode, a first electrode and a second electrode, said control, first and second electrodes being respectively connected to a word line, a first bit line and a first node;

a first ferroelectric capacitor having a first electrode and a second electrode, said first and second electrodes being respectively connected to the first node and connected to a plate line through a second node; and a first resistor connected between the first node and the second node, and a dummy memory cell including, a second select transistor having a control electrode, a first electrode and a second electrode, said control, first and second electrodes of the second select transistor being respectively connected to said word line, a second bit line, and a third node, wherein a bit line signal on the second bit line is an inverse of a bit line signal of the first bit line;

a second ferroelectric capacitor having a first electrode and a second electrode, said first and second electrodes of the second ferrorelectric capacitor being respectively connected to the third node and connected to the plate line through a fourth node; and a second resistor connected between the third node and the fourth node.

5. The ferroelectric memory according to claim 1, wherein each of said first and second resistors comprises a wiring resistance or a diffused resistance.

6. The ferroelectric memory according to claim 1, wherein each of said first and second resistors has a resistance value such that the time constant of a discharge developed through a junction leak current flowing through the resistor is less than that of depolarization of the corresponding ferroelectric memory and does not influence the transfer of an electric charge at data reading.

* * * * *